US006534406B1

(12) United States Patent
Howard et al.

(10) Patent No.: US 6,534,406 B1
(45) Date of Patent: Mar. 18, 2003

(54) METHOD FOR INCREASING INDUCTANCE OF ON-CHIP INDUCTORS AND RELATED STRUCTURE

(75) Inventors: David J. Howard, Irvine, CA (US); Q.Z Liu, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/668,790

(22) Filed: Sep. 22, 2000

(51) Int. Cl.[7] ............................................. H01L 21/44
(52) U.S. Cl. ...................... 438/687; 438/381; 438/766; 438/783; 438/688; 257/531
(58) Field of Search ...................... 438/687–88, 381, 438/766, 783; 257/531

(56) References Cited

U.S. PATENT DOCUMENTS

| 4,012,738 A | * | 3/1977 | Wright ........................ 343/18 |
| 4,745,401 A | * | 5/1988 | Monteau ...................... 340/572 |
| 5,537,116 A | * | 7/1996 | Ishino et al. ................... 342/1 |
| 5,901,022 A | * | 5/1999 | Ker ............................ 361/56 |
| 6,045,747 A | * | 4/2000 | Holm ......................... 264/618 |
| 6,057,202 A | * | 5/2000 | Chen et al. ................. 438/381 |
| 6,108,569 A | * | 8/2000 | Shen ........................... 505/210 |
| 6,160,303 A | * | 12/2000 | Fattaruso .................... 257/531 |
| 6,165,803 A | * | 12/2000 | Chen et al. ..................... 438/3 |
| 6,191,468 B1 | * | 2/2001 | Forbes et al. ................. 257/531 |
| 6,309,922 B1 | * | 10/2001 | Liu et al. .................... 438/238 |
| 6,311,145 B1 | * | 10/2001 | Hershenson et al. ........... 703/2 |
| 6,396,122 B1 | * | 5/2002 | Howard et al. ............. 257/531 |
| 6,417,755 B1 | * | 7/2002 | Liu et al. .................... 336/200 |

FOREIGN PATENT DOCUMENTS

| EP | 0-424809 A2 | * | 10/1990 | ............ G11B/7/24 |
| EP | 1030320 | * | 2/2000 | ............ H01F/17/00 |
| JP | 59-232403 | * | 12/1984 | |
| JP | 2002-11646 | * | 6/2000 | ............ B24B/13/00 |

OTHER PUBLICATIONS

M. Yanaguchi et al. "Characteristics and analysis of a thin film inductor with closed magnetic circuit structure" IEEE Transactions on Magnetic vol. 28 No. 5, Sep. 1992, p. 3015.*

* cited by examiner

Primary Examiner—Matthew Smith
Assistant Examiner—Granville D Lee, Jr.
(74) Attorney, Agent, or Firm—Farjami & Farjami LLP

(57) ABSTRACT

A disclosed embodiment comprises patterning a conductor in a dielectric in a semiconductor die. The dielectric can be, for example, silicon oxide or a low-k dielectric while the conductor can comprise aluminum, copper, or a copper-aluminum alloy. Thereafter, a blanket of high permeability layer is deposited over the dielectric. The high permeability layer can comprise high permeability materials such as nickel, iron, nickel-iron alloy, or a magnetic oxide. The blanket deposition of the high permeability layer can be accomplished by, for example, a sputtering technique. After depositing the high permeability layer, a portion of the atoms or molecules in the high permeability layer is driven into the underlying dielectric to increase the permeability of the dielectric. As an example, an ion implanter using heavy ions such as silicon ions or germanium ions can be used to drive some of the atoms or molecules in the high permeability layer into the underlying dielectric. As a result, the permeability of at least a top portion of the dielectric increases. The increase in the permeability of the dielectric results in an increase in the inductance of the conductor patterned into the dielectric. The resulting structure, according to one embodiment, comprises a dielectric whose top portion has been penetrated by high permeability atoms or molecules. An inductor patterned into this top portion of the dielectric has a "converted permeability" which is greater than the permeability of the bottom portion of the dielectric which has not been penetrated by the high permeability atoms or molecules.

16 Claims, 7 Drawing Sheets

METHOD FOR INCREASING INDUCTANCE OF ON-CHIP INDUCTORS AND RELATED STRUCTURE

The present application is related to co-pending applications entitled "method for fabrication of high inductance inductors and related structure," filed on Aug. 25, 2000, Ser. No. 09/649,442, and assigned to the assignee of the present application and "method for fabricating on-chip inductors and related structure," filed on Sep. 8, 2000, Ser. No. 09/658,483, and assigned to the assignee of the present application. The disclosure in those co-pending applications are hereby incorporated fully be reference into the present application.

BACKGROUND OF THE INVENTION

1. Field of the Invention

The present invention is generally in the field of semiconductor chips. In particular, the present invention is in the field of inductors used in semiconductor chips.

2. Background Art

FIG. 1 shows a top view of a conventional inductor 100 on an area of a semiconductor die. The inductor shown in FIG. 1 is commonly used in semiconductor chips and is referred to as a "square spiral inductor." The four metal turns of inductor 100 are referred to by numerals 104, 106, 108, and 110. Metal turns 104, 106, 108, and 110 are patterned within dielectric 102 in a manner known in the art. Thus, the areas of dielectric 102 which are flanked by metal turns 104, 106, 108, and 110 are within the electromagnetic field that will be created by metal turns 104, 106, 108, and 110. Dielectric 102 can be silicon dioxide or a low-k dielectric. Metal turns 104, 106, 108, and 110 can be aluminum, copper, or a copper-aluminum alloy.

Metal turns 104, 106, 108, and 110 are patterned on one metal layer. Metal turn 110 comprises connection terminal 12. Connection terminal 112 is thus a part of inductor 100 while also functioning as a first connection terminal of inductor 100. Connection terminal 114 is also a part of inductor 100 and functions as a second connection terminal of inductor 100. However, connection terminal 114 is patterned on a different metal layer of the die than the rest of inductor 100 to allow connection terminal 114 to cross underneath or above metal turns 104, 106, 108 and 110 of inductor 100 without shorting the metal turns together. An electrical connection between connection terminal 114 and the remainder of the metal used to fabricate metal turns 104, 106, 108, and 110 of inductor 100 is then provided by a via. Connection terminal 114 is shown in a different shade to show that it is situated on a different metal layer of the die than the remainder of the metal used to fabricate inductor 100. The width of inductor 100 is referred to by numeral 116.

The inductance value of a square spiral inductor, such as inductor 100, is determined by the empirical equation:

$$L \cong 0.38\, \mu_0 n^2 d \quad \text{(Equation 1)}$$

where L is the net effective inductance, $\mu_0$ is the permeability of free space ($\mu_0 = 4\pi(10^{-13})$ henrys/$\mu$m), n is the number of metal turns, d is the "spiral diameter" which is a term used to refer to width 116 of inductor 100, and 0.38 is a coefficient which is derived from the shape of the inductor. As an example, if a circuit on a semiconductor chip required a square spiral inductor with a value of 30 nano henrys and a pitch of one turn per 5.0 microns, the inductor would require 17 metal turns and would have a spiral diameter of 217 microns.

On-chip inductors can be used in mixed-signal circuits and in RF applications such as receiver chips in wireless telephone technologies. Typical inductor values for a square spiral inductor used in such applications range from 1 to 100 nano henrys. It can be seen from the above example that to achieve these desired values of inductance, a very large area of the chip has to be set aside for the inductor. In fact, these inductors tend to dominate the chip, leaving less area for other circuit elements. Thus, the inductor's size limits the use of on-chip inductors for RF and mixed-signal circuits.

As can be seen from Equation 1, device engineers can achieve a higher inductance value by increasing the number of metal turns of the inductor. However, as the number of metal turns increases, the overall resistance of the metal turns will also increase due to the increasing length of the metal turns. The increased resistance of the metal turns results in a lower quality factor ("Q"), since the quality factor is determined by Q=L/R, where L is the inductance and R is the resistance inherent in the inductor. For a given inductance, as the resistance increases, the quality factor decreases.

Alternatively, the inductance can be increased by increasing the spiral diameter of the on-chip inductor. However, this would make the on-chip inductor even larger and would require more chip space. As explained above, square spiral inductors already dominate the chip. Therefore, there is little available space on the chip for even larger inductors.

Thus, it is seen that there are problems associated with both of the above described methods for increasing the inductance of a square spiral inductor. Either the size of the inductor will increase further by increasing the spiral diameter of the inductor, or the quality factor will go down as a result of an increased number of metal turns within a given spiral diameter of the inductor.

As a result of these problems, device engineers have been trying to achieve a higher inductance without an increase in the space occupied by the inductor on the chip and without a decrease in the quality factor of the inductor. Thus, variations in the layout of the on-chip inductor have been made to optimize the inductance value and quality factor of the inductor.

One such variation is the "hollow spiral inductor." This on-chip inductor is similar to the square spiral inductor except that some of the metal turns at the center of the inductor are removed while the outer metal turns remain. The missing center metal turns result in lower overall resistance of the inductor and therefore a higher quality factor. Thus, by using a hollow spiral inductor instead of a square spiral inductor, a higher quality factor can be achieved for an on-chip inductor with a given spiral diameter and a given number of metal turns.

The inductance of a hollow spiral inductor is determined by the empirical equation:

$$L \cong (37.5 \mu_0 n^2 a^2)/(11d - 14a) \quad \text{(Equation 2)}$$

where L is the net effective inductance, $\mu_0$ is the permeability of free space ($\mu_0 = 4\pi(10^{-13})$ henrys/$\mu$m), n is the number of metal turns, d is the "spiral diameter" which is substantially the same as the width of the hollow spiral inductor, a is the "spiral radius" which is arrived at by empirical calculations and is equal to or slightly less than one half of the value of the spiral diameter d, and 37.5 is a coefficient that has been determined empirically.

Similarly, other variations in the layout of on-chip inductors have been used to reduce the size of the on-chip inductor while maintaining a high inductance. However, the reduction in the size of on-chip inductors that has been achieved by these variations in the layout of the inductor has been outpaced by the continuing "scaling down" of the chip size over time. Thus, the continuing trend towards smaller chips has resulted in a need for even smaller on-chip inductors.

Another shortcoming with known inductors, such as inductor 100, is that when for various reasons it is permissible to have a smaller inductance, a "scaled down" value of inductance cannot be easily achieved by reducing the number of turns n. The reason is that when the number of turns n decreases, the inductance decreases in proportion to a decrease in the value of $n^2$. This decrease in the value of inductance is desirable, but it is always accompanied by a degradation in the quality factor Q. The reason is that a reduction in the number of turns n causes a reduction in the value of the resistance R inherent in the inductor in linear proportion to n. As such, the quality factor Q which is given by L/R, is also reduced by a factor of n. This decrease in quality factor Q is clearly undesirable and is a result of an attempt to reduce the value of the inductance L by simply reducing the number of turns n.

Thus, there is a serious need in the art for an on-chip inductor that occupies a smaller space on the semiconductor chip, while having at the same time a high value of inductance and a high quality factor.

SUMMARY OF THE INVENTION

The present invention is directed to method for increasing inductance of on-chip inductors and related structure. Various embodiments of the present invention address and overcome the serious need in the art for an on-chip inductor that occupies a small space on the semiconductor chip, while having at the same time a high value of inductance and a high quality factor.

One embodiment of the invention comprises patterning a conductor in a dielectric in a semiconductor die. The dielectric can be, for example, silicon oxide or a low-k dielectric while the conductor can comprise aluminum, copper, or a copper-aluminum alloy. Thereafter, a blanket of high permeability layer is deposited over the dielectric. The high permeability layer can comprise high permeability materials such as nickel, iron, nickel-iron alloy, or a magnetic oxide. The blanket deposition of the high permeability layer can be accomplished by, for example, a sputtering technique.

After depositing the high permeability layer, a portion of the atoms or molecules in the high permeability layer is driven into the underlying dielectric to increase the permeability of the dielectric. As an example, an ion implanter using heavy ions such as silicon ions or germanium ions can be used to drive some of the atoms or molecules in the high permeability layer into the underlying dielectric. As a result, the permeability of at least a top portion of the dielectric increases. The increase in the permeability of the dielectric results in an increase in the inductance of the conductor patterned into the dielectric.

The resulting structure, according to one embodiment of the invention, comprises a dielectric whose top portion has been penetrated by high permeability atoms or molecules. An inductor patterned into this top portion of the dielectric has a "converted permeability" which is greater than the permeabity of the bottom portion of the dielectric which has not been penetrated by high permeability atoms or molecules.

DETAILED DESCRIPTION OF THE INVENTION

The present invention is directed to method for increasing inductance of on-chip inductors and related structure. The following description contains specific information pertaining to different types of materials, layouts, dimensions, and implementations of the invention's inductor. One skilled in the art will recognize that the present invention may be practiced with material, layout, or dimensions different from those specifically discussed in the present application. Moreover, some of the specific details of the invention are not discussed in order to not obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

By way of background, when a material is placed within the electromagnetic field of an inductor, the magnetic dipoles of the material interact with the electromagnetic field created by the inductor. If the electromagnetic field of the inductor is reinforced by the magnetic moments, a larger number of flux lines are created, thus increasing the inductance. The ability of a material to reinforce the electromagnetic field of the inductor is determined by the permeability of the material. Permeability is the property of a material which describes the magnetization developed in that material when excited by an electromagnetic field.

Figure 1:
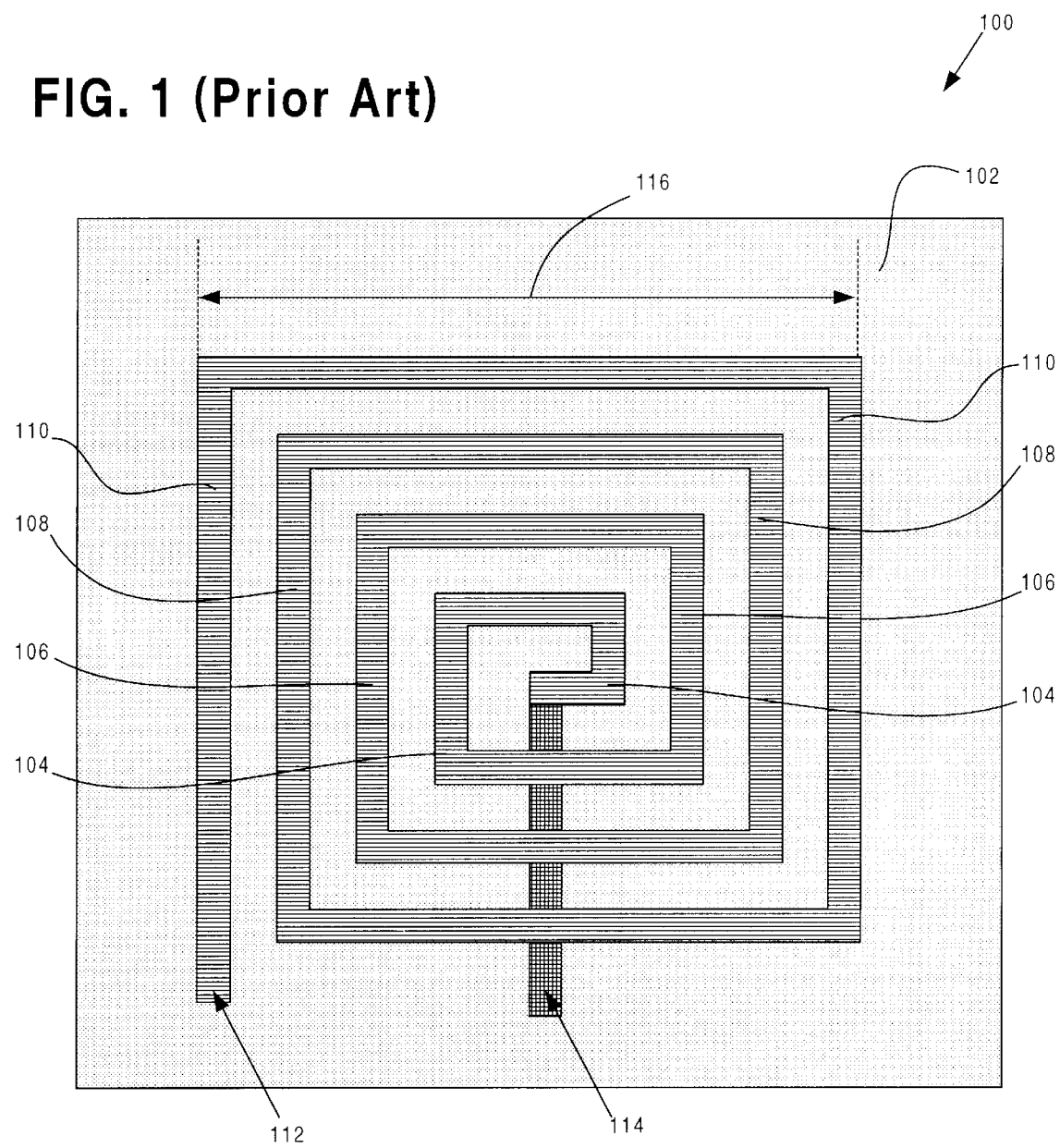
FIG. 1 illustrates a top view of a known inductor used in an area of a semiconductor die.

In the discussion of FIG. 1 in the background section of this application the permeability of dielectric 102, which is situated within the electromagnetic field that will be created by metal turns 104, 106, 108, and 10 of inductor 100, was not included in Equation 1. This was because dielectric 102 was silicon dioxide or a low-k dielectric material in the example shown in FIG. 1 and the permeability of silicon dioxide or a low-k dielectric is approximately equal to 1.0. Therefore, Equation 1 would apply to materials, such as silicon dioxide, whose permeability is approximately equal to 1.0.

However, if other materials with higher values of permeability are placed within the electromagnetic field of the inductor, the net effective inductance of square spiral inductor 100 is calculated by the equation:

$$L \approx 0.38\, \mu_0 \mu n^2 d \quad \text{(Equation 3)}$$

where L is the net effective inductance, $\mu_0$ is the permeability of free space ($\mu_0 = 4\pi(10^{-13})$ henrys/$\mu$m), $\mu$ is the relative permeability of the material placed within the electromagnetic field of the inductor, n is the number of metal turns, d is the "spiral diameter" which is a term used to refer to width 116 of inductor 100, and 0.38 is a coefficient which is derived empirically from the shape of the inductor.

It is seen from Equation 3 that the net effective inductance can be increased by placing a material with a high permeability within the electromagnetic field of the inductor. There are many classes of materials that have very high permeability. For example, a certain class of metals, including iron and nickel, have relative permeability values in the thousands. Some alloys have even higher relative permeability values, some in the millions. For example, nickel-iron alloys have a much higher permeability than iron alone. In addition, some magnetic oxides also have high values of relative permeability. These magnetic oxides are usually made of ferrites, i.e. crystalline minerals composed of iron oxide in combination with some other metal. As an example, a type of ferrite magnetic oxide having a spinel structure can be used as a high permeability material. Thus, if a high permeability material, such as one of those specifically mentioned above, is placed within the electromagnetic field of the inductor, $\mu$ in Equation 3 will be high, resulting in a high inductance value for a given spiral diameter and a given number of metal turns. In the present application, a high permeability material, such as the ones mentioned above, is also referred to as a "permeability conversion material."

The present invention increases the permeability of the dielectric material that will be within the electromagnetic field of the inductor on a semiconductor chip by introducing into the dielectric material high permeability atoms or molecules. These high permeability atoms or molecules will increase the permeability of the dielectric material significantly. A layer of high permeability material can be deposited over the dielectric material whose permeability is to be increased by utilizing sputtering or e-beam evaporation techniques. During a subsequent implantation step, ionized atoms or molecules of another material bombard the layer of high permeability material and drive a portion of the high permeability atoms or molecules into the dielectric material. This bombardment step is also referred to as a "conversion step" in the present application.

Figure 2A:
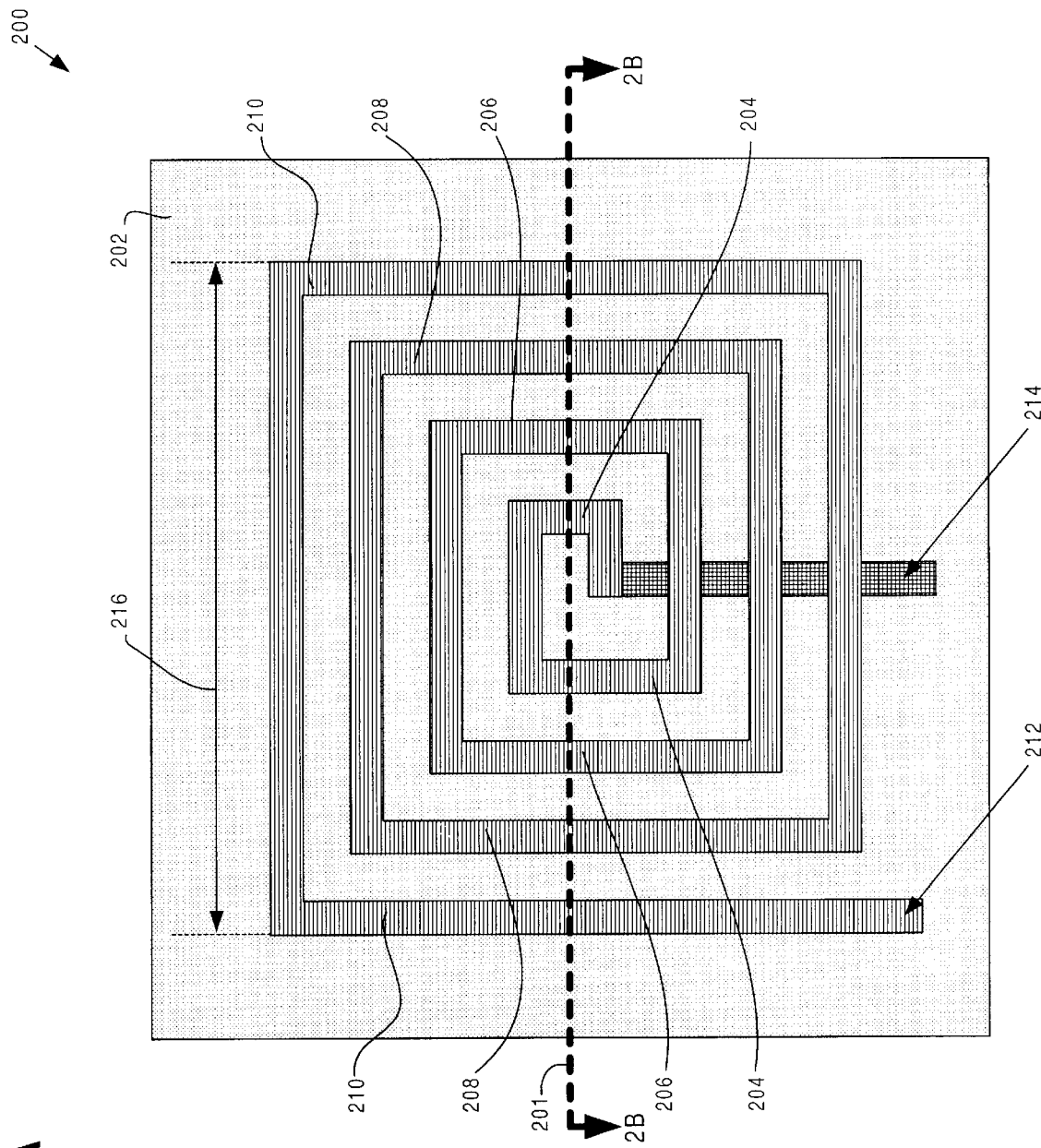
FIG. 2A illustrates a top view of an embodiment of the invention's inductor.

FIG. 2A show's a top view of the invention's inductor 200 on an area of a semiconductor die. In this example, the inductor is configured as a square spiral inductor. The four metal turns of inductor 200 are referred to by numerals 204, 206, 208, and 210. Metal turns 204, 206, 208, and 210 are patterned within dielectric 202 in a manner known in the art. Thus, the areas of dielectric 202 which are flanked by metal turns 204, 206, 208, and 210 are within the electromagnetic field that will be created by metal turns 204, 206, 208, and 210. Dielectric 202 can be silicon dioxide or a low-k dielectric. Examples of low-k dielectrics that can be used in the present embodiment are porous silica, fluorinated amorphous carbon, aromatic hydrocarbon, carbon-doped oxide, parylene, polyarylene ether, silsesquioxane, fluorinated silicon dioxide, and diamondlike carbon. All of these dielectrics have a dielectric constant below the widely used dielectric silicon dioxide which has a dielectric constant of approximately 4.0. Metal turns 204, 206, 208, and 210 can be aluminum, copper, or a copper-aluminum alloy.

Metal turns 204, 206, 208, and 210 are patterned on one metal layer. Metal turn 210 comprises connection terminal 212. Connection terminal 212 is thus a part of inductor 200 while also functioning as a first connection terminal of inductor 200. Connection terminal 214 is also a part of inductor 200 and functions as a second connection terminal of inductor 200. However, connection terminal 214 is patterned on a different metal layer of the chip than the rest of inductor 200 to allow connection terminal 214 to cross underneath metal turns 204, 206, 208 and 210 of inductor 200 without shorting the metal turns together. An electrical connection between connection terminal 214 and metal turn 204 of inductor 200 is then provided, for example, by means of a via. Connection terminal 214 is shown in a different shade to show that it is situated on a different metal layer of the chip than the remainder of the metal used to fabricate inductor 200. The width of inductor 200 is referred to in FIG. 2A by numeral 216.

By way of overview, in one embodiment of the invention, after the inductor's metal turns are patterned into the metal layer, a layer of high permeability material can be laid on the entire die surface using ion sputtering techniques. As an example of this embodiment of the invention, a layer of iron or nickel could be deposited across the surface of the die. As other examples, a metal alloy or a magnetic oxide can be deposited across the surface of the die. The metal alloy deposition may be desirable, as some metal alloys have higher permeability than the individual metals alone.

If ion sputtering is used as the deposition technique, a target of high permeability material is placed in a vacuum chamber along with the wafer and the target is grounded. In the present example, argon gas within the chamber is ionized to create positive ions of argon which are then attracted to the grounded high permeability target. The argon ions collide with the target material and the collision causes atoms or molecules of the high permeability target material to scatter from the target onto the surface of the die.

Subsequent to the blanket deposition of a desired high permeability material, an implantation step is used to cause a portion of the high permeability material to penetrate the surface of the die. A high current ion implanter could be used to ionize and separate individual atoms or molecules of a material having relatively heavy ions or molecules, such as silicon or germanium, and accelerate and form them into a beam which would be swept across the surface of the high permeability layer. The individual ionized-atoms or molecules would collide with the high permeability layer, causing a portion of the high permeability atoms or molecules to penetrate into the area of the die where it is desirable that there be an increased permeability, referred to in the present application as the "target area." The high permeability atoms or molecules would come to a stop below the surface of the target area of the die. Other ions, such as argon or oxygen ions, may be used in place of silicon and germanium ions to cause a portion of the high permeability atoms or molecules to penetrate the surface of the die.

The ion implanter used in the process described above is a typical ion implanter that is used in ion implantation steps required for fabricating semiconductor dies. For example, the ion implanters are used to implant arsenic, boron, silicon, germanium, and argon atoms into the die to form doped regions on the die. In addition, the deposition techniques described in the present application for depositing the high permeability layer onto the die are also commonly used for fabrication of semiconductor dies.

Figure 2B:
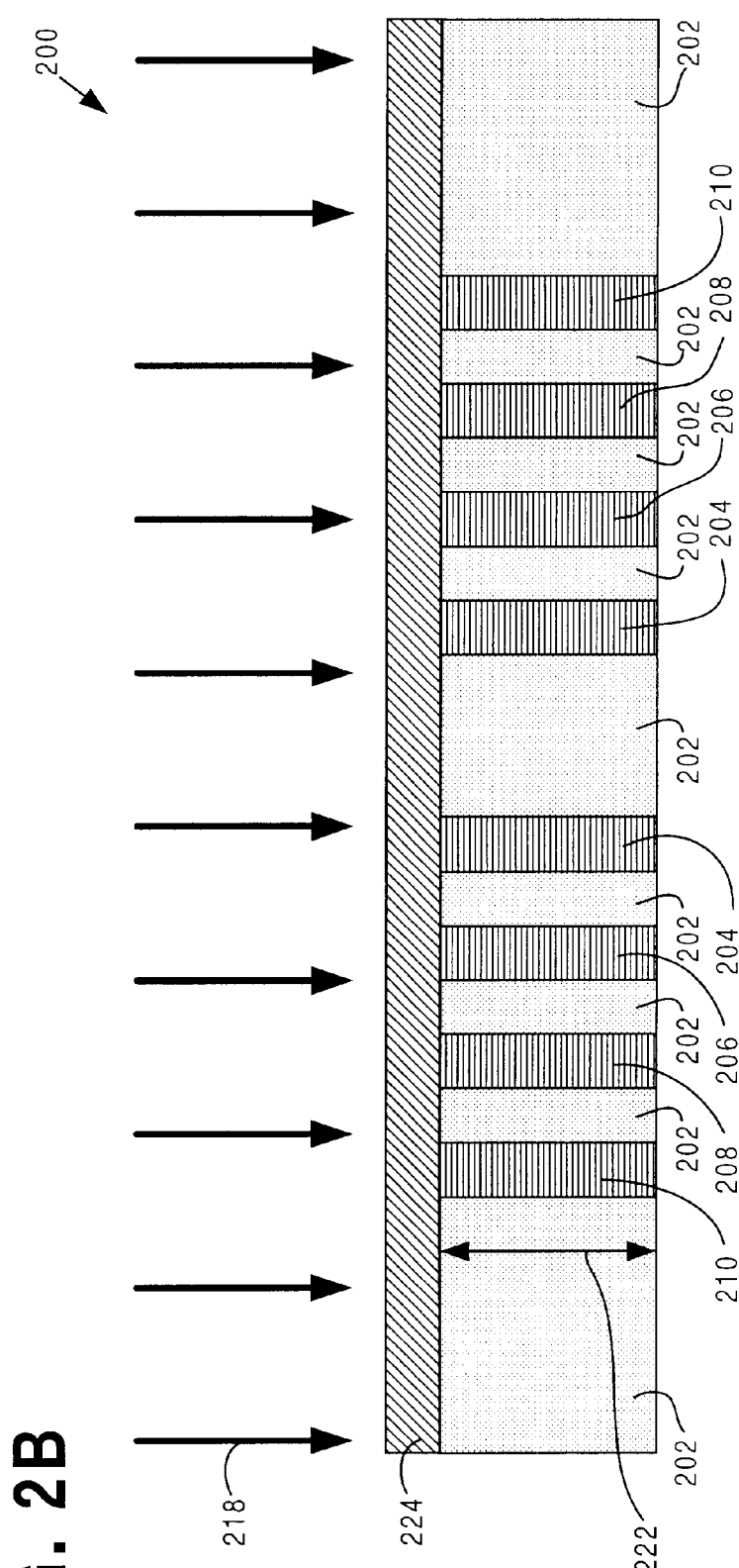
FIG. 2B illustrates a cross section view of an embodiment of the invention's inductor including a blanket high permeability layer, during an ion implantation step.

FIG. 2B shows a cross section of inductor 200 during the implantation step. Where the cross section is taken is shown in FIG. 2A by a cross section line 2B, also referred to by numeral 201. A previous sputtering step was used to deposit a blanket layer of high permeability atoms or molecules, referred to by numeral 224, across the entire surface of the die. Metal segments 204, 206, 208, and 210 are cross section views of metal turns 204, 206, 208, and 210, respectively. For simplicity, the cross section views of metal turns 204, 206, 208 and 210 shown in FIG. 2B are also referred to as metal turns 204, 206, 208 and 210. In the present embodiment of the invention, these metal turns of inductor 200 are patterned, in a manner known in the art, into the topmost metal layer of the semiconductor die. Although the topmost metal layer is used in the present embodiment, the invention could be implemented on any metal layer of the die.

In this embodiment of the invention, on-coming ions bombard the entire surface of high permeability layer 224. No masking step is required, which results in a cost saving. This process is referred to in the present application as the "blanket conversion process." In the absence of a mask, ionized atoms or molecules, referred to by numeral 218, cause a portion of the atoms or molecules within high permeability layer 224 to penetrate into the entire surface of the die, including dielectric 202 and metal turns 204, 206, 208, and 210. Thus, in the blanket conversion process the entire surface of the die is the target area.

In the present example, the thickness of dielectric 202 and metal turns 204, 206, 208, and 210, referred to by numeral 222, is approximately 3.0 microns. Using a high current implanter, ionized atoms or molecules 218 will cause a portion of atoms or molecules within high permeability layer 224 to penetrate into the target area to a depth of at least 1.0% of the depth of dielectric 202 and metal turns 204, 206, 208, and 210, i.e., to a depth of at least 0.03 microns. The depth of penetration into the target area by the high permeability atoms or molecules is related to the thickness of high permeability layer 224 and to the energy generated by the implanter.

Figure 2C:
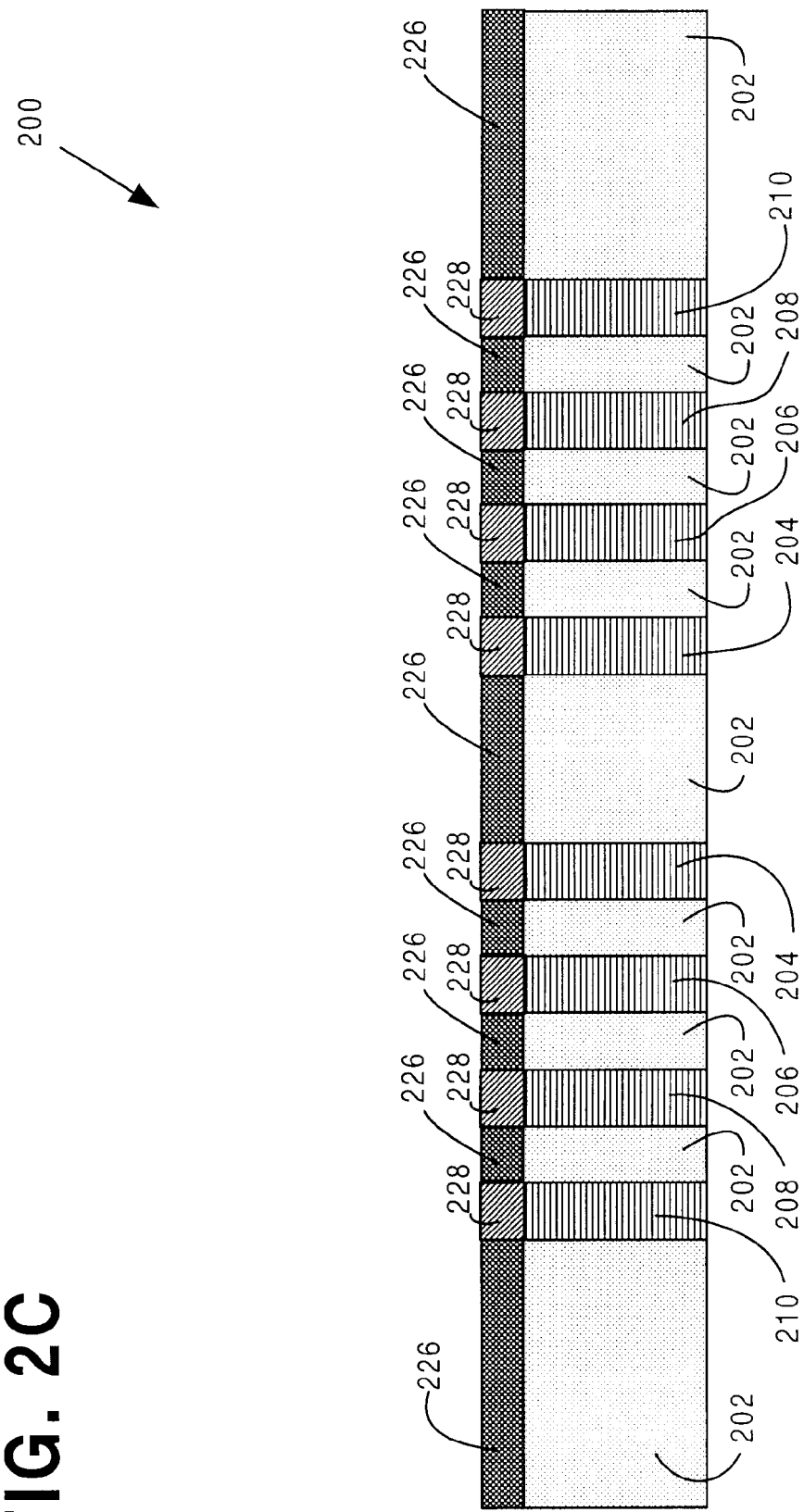
FIG. 2C illustrates a cross section view of an embodiment of the invention's inductor, showing the penetration of high permeability atoms or molecules into a top portion of the dielectric.

FIG. 2C shows inductor 200 after the conversion step. Any excess material from high permeability layer 224 that did not penetrate into the target area has been removed during a planarization step. In an alternative implementation of the present embodiment, the excess material can remain over the target area. The material of high permeability layer 224 has been introduced into top portion 226 of dielectric 202. As a result, top portion 226 of dielectric 202 has a "converted permeability" which is higher than the permeability of the remaining unaffected portion of dielectric 202. The remaining unaffected portion of dielectric 202 is also referred to as a "bottom portion" of dielectric 202 in the present application. The area of top portion 226 that is situated within the electromagnetic field of inductor 200 will result in a higher inductance for inductor 200, as can be seen from Equation 3.

A post-implant anneal may be required to electrically activate high permeability material within top portion 226 of dielectric 202 and to repair any damage prior to the deposition of a passivation layer on the die. A typical anneal within a hydrogen or nitrogen atmosphere in a tube furnace will take place at a temperature of between 300 and 1000 degrees Centigrade.

The invention's blanket conversion process described above drives a portion of the atoms or molecules within the high permeability layer into top portion 226 of dielectric 202 and also top portion 228 of the metal turns of the inductor. The presence of these high permeability atoms or molecules within top portion 228 of the metal turns may result in a reduction of the conductivity of the metal turns of the inductor. However, this reduction in the conductivity of the metal turns of the inductor may be acceptable in many applications where the conductivity is not a critical factor. If it is desirable to avoid this reduction in the conductivity, a masking step may be used to protect the metal turns from penetration by the high permeability atoms or molecules as described below.

As stated above, in another embodiment of the invention, a masking step can be used in order to selectively convert only the areas of dielectric material between the metal turns of the inductor. This process is referred to in the present application as a "selective conversion process." Thus, the area of dielectric material between the metal turns of the inductor is the target area in this embodiment. The remainder of the die, including the metal turns of the inductor, is covered by a mask which can comprise, for example, silicon nitride or silicon oxide.

By using a mask to isolate the area of penetration of the high permeability atoms or molecules to the target area, any undesirable changes in the conductivity of the metal turns of the inductor, or in other parameters of the remainder of the die, resulting from the penetration of high permeability atoms or molecules is avoided. Thus, the permeability of the target area of dielectric material will be increased while the permeability, conductivity, and other parameters of the remaining untargeted areas of the die will remain unaffected. The implementation of the invention's selective conversion process is discussed below in relation to FIG. 3A and FIG. 3B.

Figure 3A:
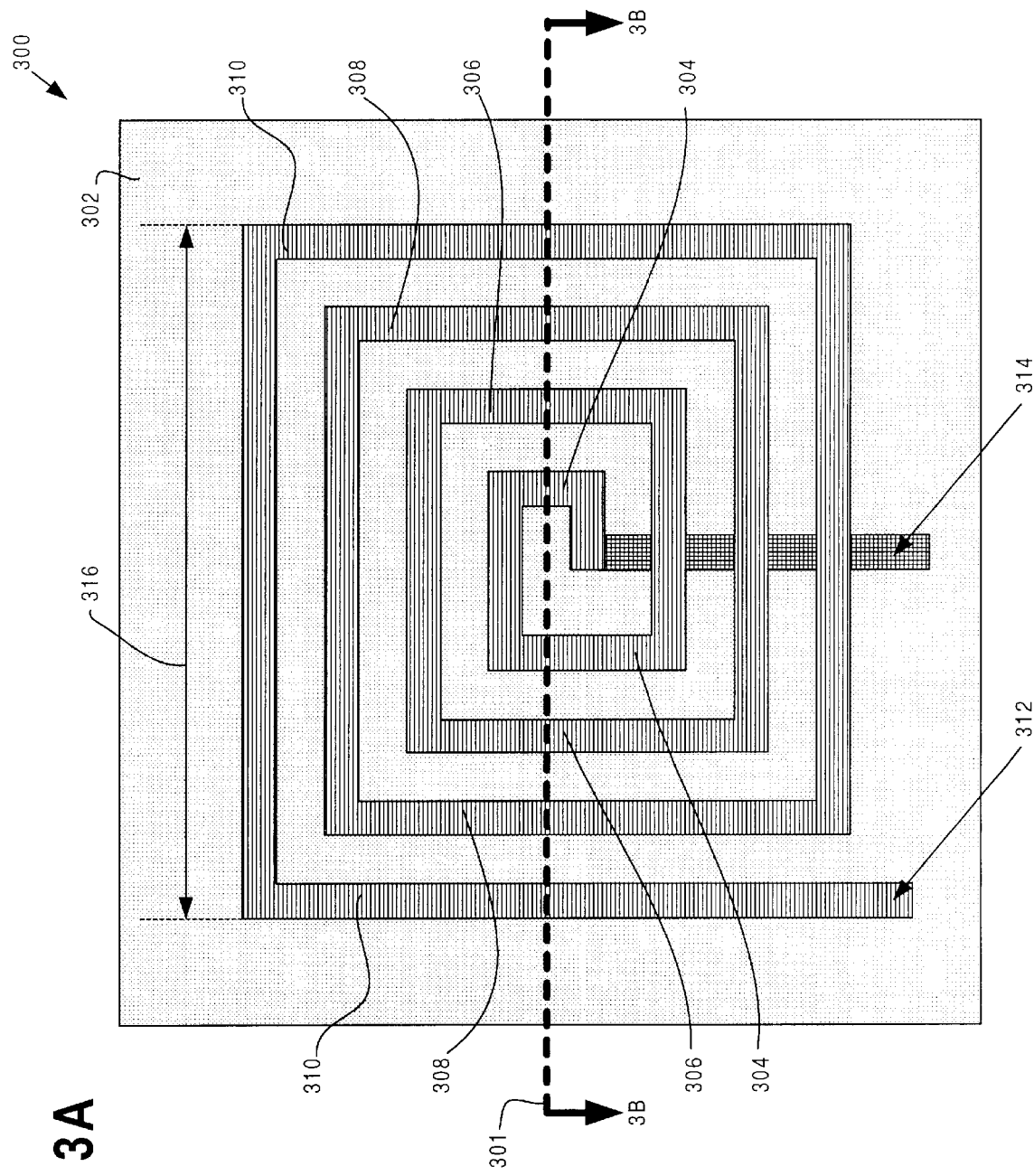
FIG. 3A illustrates a top view of an embodiment of the invention's inductor.

FIG. 3A shows a top view of the invention's inductor 300 on an area of a semiconductor die. In this example, the inductor is configured as a square spiral inductor. The four metal turns of inductor 300 are referred to by numerals 304, 306, 308, and 310. Metal turns 304, 306, 308, and 310 are patterned within dielectric 302 in a manner known in the art. Thus, the areas of dielectric 302 which are flanked by metal turns 304, 306, 308, and 310 are within the electromagnetic field that will be created by metal turns 304, 306, 308, and 310. Dielectric 302 can be silicon dioxide or a low-k dielectric. As stated above, examples of low-k dielectrics that can be used in the present embodiment are porous silica, fluorinated amorphous carbon, aromatic hydrocarbon, carbon-doped oxide, parylene, polyarylene ether, silsesquioxane, fluorinated silicon dioxide, and diamondlike carbon. All of these dielectrics have a dielectric constant below the widely used dielectric silicon dioxide which has a dielectric constant of approximately 4.0. Metal turns 304, 306, 308, and 310 can be aluminum, copper, or a copper-aluminum alloy.

Metal turns 304, 306, 308, and 310 are patterned on one metal layer. Metal turn 310 comprises connection terminal 312. Connection terminal 312 is thus a part of inductor 300 while also functioning as a first connection terminal of inductor 300. Connection terminal 314 is also a part of inductor 300 and functions as a second connection terminal of inductor 300. However, connection terminal 314 is patterned on a different metal layer of the chip than the rest of inductor 300 to allow connection terminal 314 to cross underneath metal turns 304, 306, 308 and 310 of inductor 300 without shorting the metal turns together. An electrical connection between connection terminal 314 and metal turn 304 of inductor 300 is then provided, for example, by means of a via. Connection terminal 314 is shown in a different shade to show that it is situated on a different metal layer of the chip than-the remainder of the metal used to fabricate inductor 300. The width of inductor 300 is referred to in FIG. 3A by numeral 316.

Figure 3B:
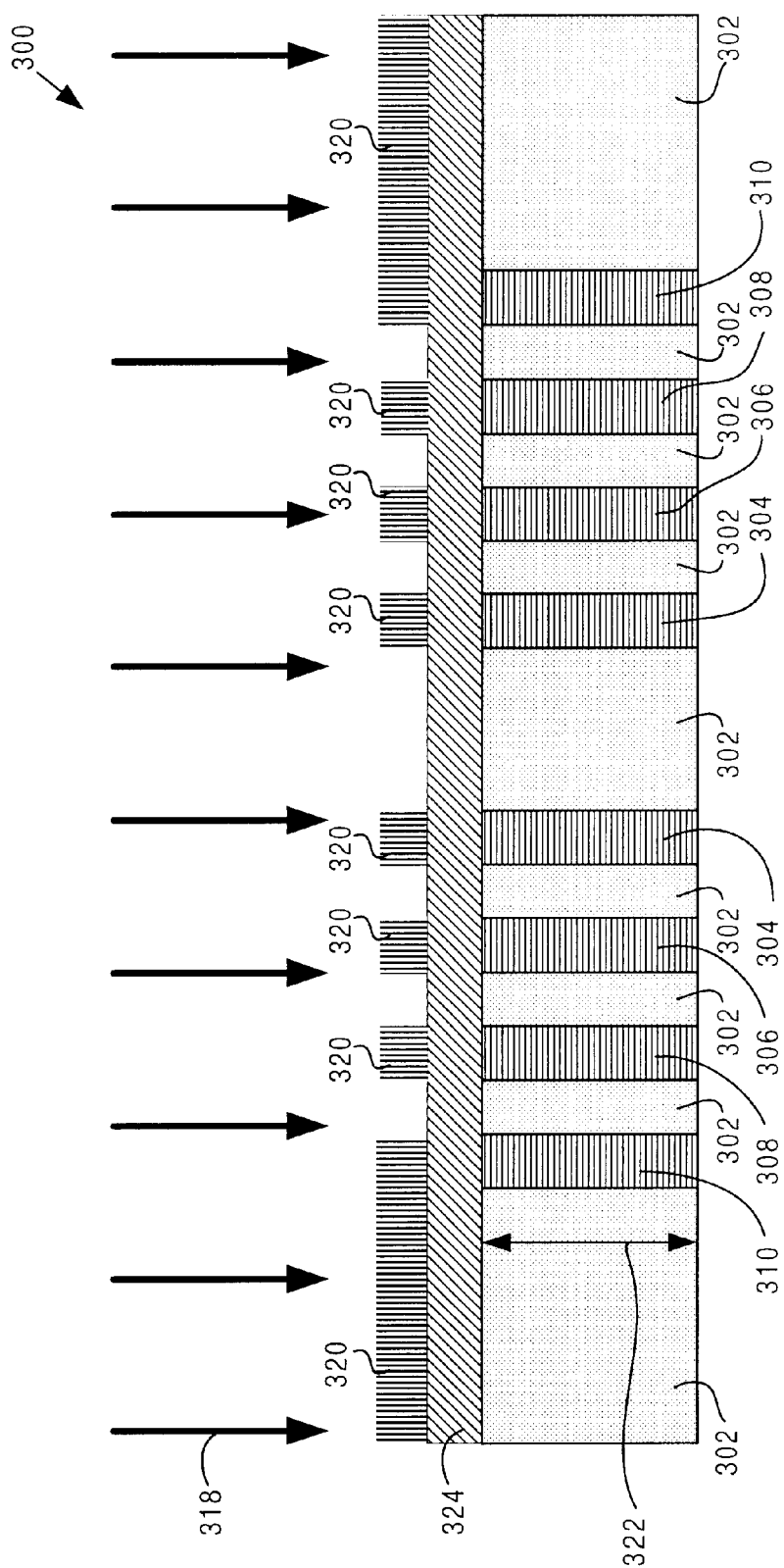
FIG. 3B illustrates a cross section view of an embodiment of the invention's inductor including a blanket high permeability layer and an overlying mask, during an ion implantation step.

FIG. 3B shows a cross section view of inductor 300 during a selective implantation step. Where the cross section is taken is shown in FIG. 3A by the cross section line 3B, also referred to by numeral 301. Metal segments 304, 306, 308, and 310 are cross section views of metal turns 304, 306, 308, and 310, respectively. For simplicity, the cross section views of metal turns 304, 306, 308 and 310 shown in FIG. 3B are also referred to as metal turns 304, 306, 308 and 310. In the present embodiment of the invention, these metal turns of inductor 300 are patterned, in a manner known in the art, into the topmost metal layer of the semiconductor die. Although the topmost metal layer is used in the present embodiment, the invention could be implemented on any metal layer of the die.

Mask 320 is shown patterned over all of high permeability layer 324 except the portions of high permeability layer 324 situated over the areas of dielectric 302 between metal turns 304, 306, 308, and 310. Those areas of high permeability layer 324 covered by mask 320 are referred to in the present application as "protected areas" of high permeability layer 324. The areas of high permeability layer 324 situated over the target areas on the surface of the die are not covered by mask 320 and are referred to in the present application as "unprotected areas" of high permeability layer 324.

Ionized atoms or molecules, referred to by numeral 318, are prevented by mask 320 from bombarding the protected areas of high permeability layer 324 and thus atoms or molecules in the protected areas of high permeability layer 324 are prevented from penetrating the surface of the die. However, ionized atoms or molecules 318 bombard the unprotected areas of high permeability layer 324 and thus cause a portion of the atoms or molecules within the unprotected areas of high permeability layer 324 to penetrate the surface of the die, i.e. to penetrate the target areas of the surface of the die.

In the present example, the depth of dielectric 302 and metal turns 304, 306, 308, and 310, referred to by numeral 322, is approximately 3.0 microns. Using a high current implanter, ionized atoms or molecules 318 will cause a portion of atoms or molecules within high permeability layer 324 to penetrate into the targeted area to a depth of at least 1.0% of the depth of dielectric 302, i.e. to a depth of at least 0.03 microns. As stated above, the depth of penetration into dielectric 302 by the high permeability atoms or molecules is related to the thickness of high permeability layer 324 and to the energy generated by the implanter.

Figure 3C:
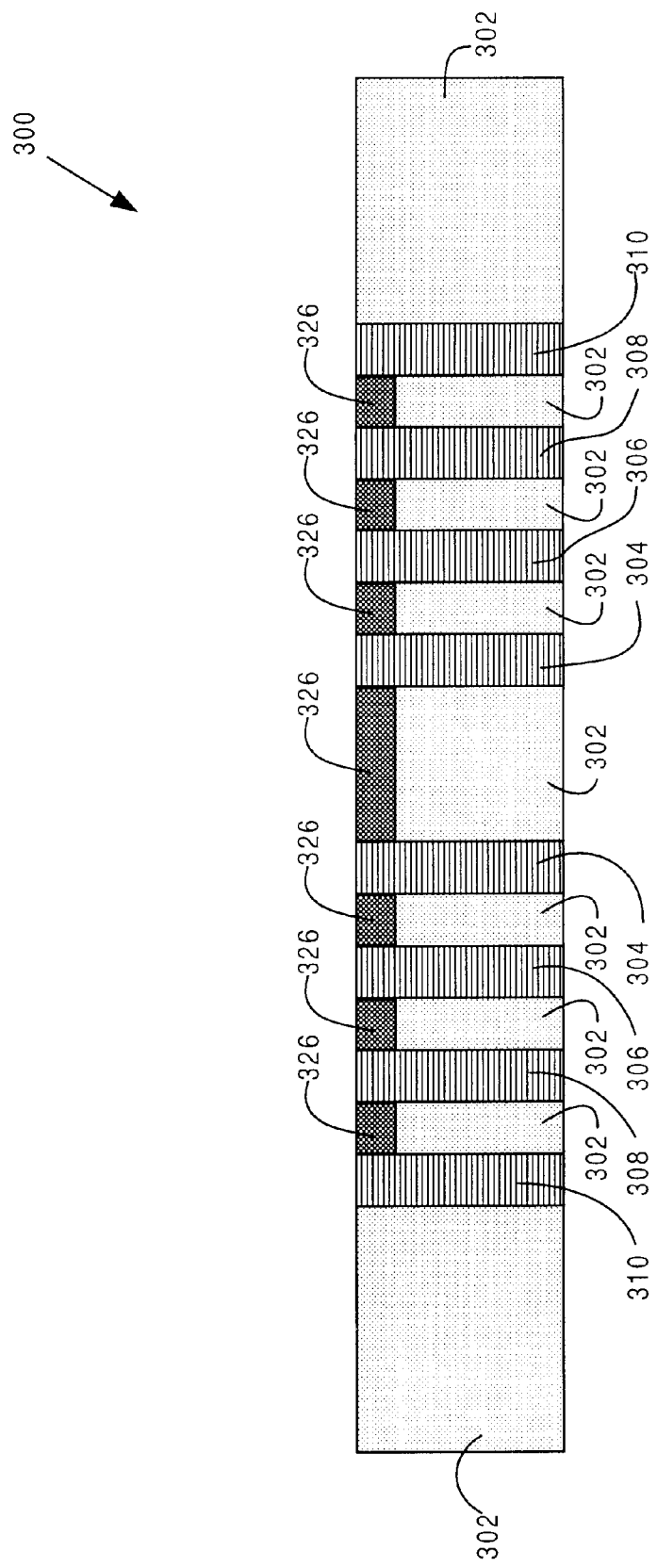
FIG. 3C illustrates a cross section view of an embodiment of the invention's inductor, showing the penetration of high permeability atoms or molecules into a top portion of the dielectric.

FIG. 3C shows inductor 300 after the completion of the selective conversion process described above. The mask has been etched and any excess material from high permeability layer 324 that did not penetrate into the target area has been removed during a planarization step. In an alternative implementation of the present embodiment, the excess material can remain over the target area. As a consequence of the selective conversion process discussed above, the material of high permeability layer 324 has been introduced into top portion 326 of dielectric 302. As a result, top portion 326 of dielectric 302 has a "converted permeability" which is higher than the permeability of the remaining unaffected portion of dielectric 302. The remaining unaffected portion of dielectric 302 is also referred to as a "bottom portion" of dielectric 302 in the present application. The area of top portion 326 that is situated within the electromagnetic field of inductor 300 will result in a higher inductance for inductor 300, as can be seen from Equation 3.

A post-implant anneal may be required to electrically activate high permeability material within top portion 326 of dielectric 302 and to repair any damage prior to the deposition of a passivation layer on the die. A typical anneal within a hydrogen or nitrogen atmosphere in a tube furnace will take place at a temperature of between 300 and 1000 degrees Centigrade.

Instead of utilizing the blanket conversion process as in the first embodiment of the present invention, or the selective conversion process as in the second embodiment of the present invention, a third embodiment of the present invention would mask all of the high permeability layer on the semiconductor die except the portion over the entire area of the square spiral inductor, including the inductor's metal turns. This process is referred to in the present application as the "inductor area conversion process." Thus, the entire area of the square spiral inductor would be the target area in this third embodiment.

Therefore, in this third embodiment, an implantation step would cause a portion of the atoms or molecules of a high permeability layer to penetrate into the entire area of the square spiral inductor, including into the metal turns of the inductor, but the remainder of the surface of the die would be protected from penetration by the high permeability atoms or molecules. This protection can be provided by a silicon nitride or oxide mask. As in the first embodiment described above, high permeability atoms or molecules may penetrate into the unprotected metal turns of the inductor using this third embodiment of the invention, resulting in a reduction in the conductivity of the metal turns of the inductor.

As an alternative to the ion sputtering step for forming a blanket layer of high permeability material discussed above, e-beam evaporation or other deposition techniques known in the art can be used in all of the embodiments discussed above to deposit the blanket layer of high permeability material on the surface of the die. Whether ion sputtering, e-beam evaporation, or other deposition techniques are used, a blanket layer of high permeability material is deposited on the surface of the die. During the implantation step described above, a portion of the atoms or molecules of the high permeability layer will penetrate into a target area. The presence of the high permeability atoms or molecules in the dielectric material increases the permeability of the dielectric material. The higher permeability of the dielectric material results in a higher inductance, as can be seen from Equation 3.

Thus, the invention allows the device engineer to increase the inductance of an on-chip inductor by increasing the permeability of the dielectric material rather than by increasing the size of the on-chip inductor, which would require a larger area of the chip to be set aside for inductors. If a very high permeability material such as a nickel-iron alloy is used, only a small amount of the material is needed to result in a significant increase in-the permeability of the dielectric material and therefore a significant increase in the inductance. As an example, if using any of the embodiments described above the blanket layer of high permeability material consisted of a nickel-iron alloy with a relative permeability value of approximately $10^6$, the resulting relative permeability of the affected portions of the underlying dielectric would be in the range of 100 to 1000.

Moreover, because the number of metal turns does not have to be increased to achieve a higher inductance value, there is no resulting increase in the resistance of the inductor and therefore no corresponding decrease in the quality factor of the on-chip inductor. Use of the invention's inductor will enable device engineers to include significantly more of the invention's inductors on a single chip, yielding significant advantages in circuit design and resulting in greater integration of passive components on a single chip.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for increasing inductance of on-chip inductors and related structure have been described.

What is claimed is:

1. A method comprising steps of:
    patterning a conductor in a dielectric in a semiconductor die;
    depositing a high permeability layer over said dielectric;
    driving a portion of said high permeability layer into said dielectric so as increase a permeability of said dielectric.

2. The method of claim 1 wherein said conductor is selected from the group consisting of aluminum, copper, and copper-aluminum alloy.

3. The method of claim 1 wherein said conductor is patterned as a square spiral.

4. The method of claim 1 wherein said dielectric is silicon dioxide.

5. The method of claim 1 wherein said dielectric is a low-k dielectric.

6. The method of claim 1 wherein said high permeability layer comprises material selected from the group consisting of nickel, iron, nickel-iron alloy, and magnetic oxide.

7. The method of claim 1 wherein said depositing step is performed by ion sputtering.

8. The method of claim 1 wherein said depositing step is performed by e-beam evaporation.

9. The method of claim 1 wherein said driving step is performed by implanting ions into said high permeability layer thereby driving said portion of said high permeability layer into said dielectric.

10. The method of claim 9 wherein said ions are selected from the group consisting of silicon ions and germanium ions.

11. The method of claim 9 wherein said ions are selected from the group consisting of argon ions and oxygen ions.

12. A structure comprising:
    a dielectric in a semiconductor die, said dielectric having a top portion and a bottom portion;
    a conductor patterned in said top portion of said dielectric;
    said top portion of said dielectric having a converted permeability, said converted permeability being greater than a permeability of said bottom portion of said dielectric, said converted permeability resulting from driving a portion of a high permeability layer into said top portion of said dielectric.

13. The structure of claim 12 wherein said conductor is selected from the group consisting of aluminum, copper, and copper-aluminum alloy.

14. The structure of claim 12 wherein said conductor is patterned as a square spiral.

15. The structure of claim 12 wherein said dielectric is silicon dioxide.

16. The structure of claim 12 wherein said dielectric is a low-k dielectric.

* * * * *